US008582785B2

(12) United States Patent
Moon

(10) Patent No.: US 8,582,785 B2
(45) Date of Patent: Nov. 12, 2013

(54) METHOD AND APPARATUS TO ENHANCE LOW FREQUENCY COMPONENTS AND MEDIUM FREQUENCY COMPONENTS OF AUDIO SIGNAL

(75) Inventor: Han-gil Moon, Seoul (KR)

(73) Assignee: SAMSUNG Electronics Co., Ltd., Suwon-si (KR)

(*) Notice: Subject to any disclaimer, the term of this patent is extended or adjusted under 35 U.S.C. 154(b) by 1191 days.

(21) Appl. No.: 11/761,417

(22) Filed: Jun. 12, 2007

(65) Prior Publication Data

US 2008/0159563 A1 Jul. 3, 2008

(30) Foreign Application Priority Data

Jan. 2, 2007 (KR) ........................ 10-2007-0000303

(51) Int. Cl.
*H03G 5/00* (2006.01)

(52) U.S. Cl.
USPC .................................. 381/99; 381/98; 381/61

(58) Field of Classification Search
USPC ........................................ 381/98, 99, 61, 103
See application file for complete search history.

(56) References Cited

U.S. PATENT DOCUMENTS 3,620,631 A * 11/1971 Stopka et al. .............. 455/244.1
4,608,903 A * 9/1986 Deutsch .......................... 84/608
6,335,973 B1 * 1/2002 Case ............................... 381/61
6,606,388 B1 8/2003 Townsend et al.
2004/0071297 A1 * 4/2004 Katou et al. .................... 381/61
2006/0147046 A1 7/2006 Kasargod et al.

FOREIGN PATENT DOCUMENTS

CN 1787078 6/2006
JP 2004101797 4/2004
WO 98/46044 10/1998

OTHER PUBLICATIONS

Chinese Office Action issued Aug. 8, 2011 in CN Application No. 200710138219.8.
Chinese Office Action dated Dec. 4, 2012 issued in CN Application No. 200710138219.8.
Korean Office Action dated Jan. 29, 2013 issued in KR Application No. 10-2007-0000303.
Chinese Office Action Issued on Apr. 26, 2012 in CN Patent Application No. 200710138219.8.
Chinese Office Action Issued on Aug. 24, 2012 in CN Patent Application No. 200710138219.8.

* cited by examiner

*Primary Examiner* — Xu Mei
*Assistant Examiner* — Con P Tran
(74) *Attorney, Agent, or Firm* — Stanzione & Kim, LLP

(57) ABSTRACT

A method and apparatus to enhance one or more low-frequency components and one or more medium-frequency components of an audio signal. The method includes performing filtering on the input audio signal using a plurality of band-pass filters, generating a plurality of harmonic-frequency signals using a plurality of audio signals resulting from the performing filtering operation, and mixing the plurality of harmonic-frequency signals with the input audio signal.

24 Claims, 6 Drawing Sheets

METHOD AND APPARATUS TO ENHANCE LOW FREQUENCY COMPONENTS AND MEDIUM FREQUENCY COMPONENTS OF AUDIO SIGNAL

CROSS-REFERENCE TO RELATED APPLICATIONS

This application claims priority under 35 U.S.C. §119(a) from Korean Patent Application No. 10-2007-0000303, filed on Jan. 2, 2007, in the Korean Intellectual Property Office, the disclosure of which is incorporated herein in its entirety by reference.

BACKGROUND OF THE INVENTION

1. Field of the Invention

The present general inventive concept relates to a method of and apparatus to enhance low-frequency components and medium-frequency components of an audio signal.

2. Description of the Related Art

A small-size speaker mounted in a portable device such as a notebook personal computer (PC) or an MP3 player has a difficulty in fully reproducing low-frequency components of an audio signal due to its physical limit, i.e., its small size. Such a difficulty may cause distortion of sound quality.

FIG. 1 illustrates a conventional low-frequency enhancing apparatus.

Referring to FIG. 1, the conventional low-frequency enhancing apparatus includes a low-pass filter 110, an SIN function generation module 122, a COS function generation module 124, a band-pass filter 130, and a mixer 140.

Upon input of an audio signal, the low-pass filter 110 performs low-pass filtering on the audio signal input for each channel in order to extract only low-frequency components (e.g., less than 120 Hz).

The SIN function generation module 122 and the COS function generation module 124 modulate low-pass filtered signals in order to generate harmonic-frequency signals.

The band-pass filter 130 performs band-pass filtering on signals transformed to an SIN function and a COS function in order to extract only harmonic-frequency signals of a predetermined order.

The mixer 140 mixes the harmonic-frequency signals filtered by the band-pass filter 130 with the input audio signal, thereby generating an audio signal having enhanced low-frequency components for each channel.

Enhancement of low-frequency components using harmonic-frequency signals uses an acoustic effect in which human ears perceive the tone of a frequency that is a multiple of a fundamental frequency as the tone of the fundamental frequency.

FIG. 2 is a view illustrating ideal harmonic-frequency signals for frequency component enhancement.

Referring to FIG. 2, a 220 Hz fundamental-frequency component and harmonic-frequency signals are illustrated. When the fundamental-frequency component is at 220 Hz as illustrated in FIG. 2, harmonic-frequency signals having frequencies that are multiples of 220 Hz, i.e., harmonic-frequency signals having 440 Hz, 660 Hz, and 880 Hz are ideal harmonic-frequency signals for frequency component enhancement. Accordingly, as the frequencies of the ideal harmonic-frequency signals increase, the amplitudes of the ideal harmonic-frequency signals decrease as illustrated in FIG. 2.

If a user hears the tones of the ideal harmonic-frequency signals, the user perceives the tones as the tone of the 220 Hz fundamental-frequency component. Thus, by using the harmonic-frequency signals, it is perceived as if the intensity of sound having a tone corresponding to 220 Hz is enhanced.

However, according to the conventional low-frequency component enhancing apparatus illustrated in FIG. 1, the amplitudes of harmonic-frequency signals do not decrease as the frequencies of the harmonic-frequency signals increase as with the ideal harmonic-frequency signals illustrated in FIG. 2. Instead, the amplitudes of harmonic-frequency signals are constant over different frequencies and distortion is caused in tones when the harmonic-frequency signals are mixed with the original audio signal.

According to a conventional medium-frequency component enhancing method, intensity of energy of an audio signal in a medium-frequency band is increased using an equalizer, causing distortion in the tone of the audio signal.

Accordingly, the conventional low-frequency component enhancing method and the conventional medium-frequency component enhancing method cause a significant change in a tone during enhancement of low-frequency components and medium-frequency components.

SUMMARY OF THE INVENTION

The present general inventive concept provides a method of and apparatus to enhance low-frequency components and medium-frequency components of an audio signal using human perception characteristics without physically boosting the energy of low-frequency components and the energy of medium-frequency components.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may also be achieved by providing a method of enhancing one or more low-frequency components and one or more medium-frequency components of an audio signal. The method includes performing filtering on the input audio signal using a plurality of band-pass filters, generating a plurality of harmonic-frequency signals using a plurality of audio signals resulting from the performing filtering operation, and mixing the plurality of harmonic-frequency signals with the input audio signal.

The performing of the filtering may include performing the filtering using a first band-pass filter that extracts one or more audio signals in a frequency band of 60-200 Hz and a second band-pass filter that extracts one or more audio signals in a frequency band of 200 Hz-2 KHz.

The generation of the plurality of harmonic-frequency signals may include generating the plurality of harmonic-frequency signals using a Single-sideband modulation.

The method may also include performing high-pass filtering on the input audio signal.

An intensity of energy of audio signals in a predetermined frequency band of the input audio signal, may be increased.

The intensity of energy of the audio signals in a frequency band of 2-20 KHz may be increased.

The method may also include adjusting amplitudes of the plurality of harmonic-frequency signals.

The method may include increasing or reducing an intensity of energy of signals in a predetermined frequency band of the input audio signal mixed with the plurality of harmonic-frequency signals.

The increasing or reducing of the intensity may include reducing the intensity of energy of audio signals in a frequency band of 2-20 KHz.

The increasing or reducing of the intensity may include increasing the intensity of energy of the audio signals in a frequency band of 0-200 Hz.

The foregoing and/or other aspects and utilities of the present general inventive concept may also be achieved by providing an apparatus to enhance one or more low-frequency components and one or more medium-frequency components of an audio signal. The apparatus includes a filtering unit to perform filtering on the input audio signal using a plurality of band-pass filters, a harmonic-frequency signal generation unit to generate a plurality of harmonic-frequency signals using a plurality of audio signals resulting from the filtering of the plurality of the band-pass filters, and a mixing unit to mix the plurality of harmonic-frequency signals with the input audio signal.

The filtering unit may include a first band-pass filter that extracts one or more audio signals in a frequency band of 60-200 Hz and a second band-pass filter that extracts one or more audio signals in a frequency band of 200 Hz-2 KHz.

The harmonic-frequency signal generation unit may generate the plurality of harmonic-frequency signals using a Single-sideband modulation.

The filtering unit may include a high-pass filter to perform high-pass filtering on the input audio signal.

The filtering unit may include a pre-processing filter to increase amplitudes of audio signals in a predetermined frequency band.

The pre-processing filter may increase the intensity of energy of audio signals in a frequency band of 2-20 KHz of the input audio signal.

The apparatus may further include a harmonic-frequency signal adjustment unit to adjust amplitudes of the plurality of harmonic-frequency signals.

The apparatus may further include a post-processing filter to increase or reduce an intensity of energy of signals in a predetermined frequency band, out of the input audio signal mixed with the plurality of harmonic-frequency signals.

The post-processing filter may reduce the intensity of energy of the audio signals in a frequency band of 2-20 KHz.

The post-processing filter may increase the intensity of energy of the audio signals in a frequency band of 0-200 Hz.

The foregoing and/or other aspects and utilities of the present general inventive concept may also be achieved by providing a computer-readable medium containing computer-readable codes to perform a method of enhancing one or more low-frequency components and one or more medium-frequency components of an audio signal. The method includes performing filtering on the input audio signal using a plurality of band-pass filters, generating a plurality of harmonic-frequency signals using a plurality of audio signals resulting from the performing filtering operation, and mixing the plurality of harmonic-frequency signals with the input audio signal.

The foregoing and/or other aspects and utilities of the present general inventive concept may also be achieved by providing an apparatus to enhance an audio signal, the apparatus including a first band-pass filter to extract one or more low-frequency signals from the audio signal, a second band-pass filter to extract one or more medium-frequency signals from the audio signal, a harmonic-frequency signal generation unit to generate a first set of harmonic-frequency signals from the one or more low-frequency signals and a second set of harmonic-frequency signals from the one or more medium-frequency signals, a harmonic-frequency signal adjustment unit to adjust amplitudes of the first set of harmonic-frequency signals and the second set of harmonic-frequency signals and a mixing unit to mix the audio signal, the adjusted first set of harmonic-frequency signals and the second set of harmonic-frequency signals.

The foregoing and/or other aspects and utilities of the present general inventive concept may also be achieved by providing a method of enhancing an audio signal, the method including filtering the audio signal to extract one or more low-frequency signals and one or more medium-frequency signals, generating a first set of harmonic-frequency signals from the one or more low-frequency signals and a second set of harmonic-frequency signals from the one or more medium-frequency signals, adjusting amplitudes of the first set of harmonic-frequency signals and the second set of harmonic-frequency signals and mixing the audio signal, the adjusted first set of harmonic-frequency signals and the second set of harmonic-frequency signals.

The foregoing and/or other aspects and utilities of the present general inventive concept may also be achieved by providing an apparatus to enhance an audio signal, comprising a harmonic-frequency signal generation unit to generate one or more first harmonic signals from a first band of an input audio signal and one or more second harmonic signals from a second band of the input audio signal; and a mixing unit to mix the first harmonic signals and the second harmonic signals with the input audio signal.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
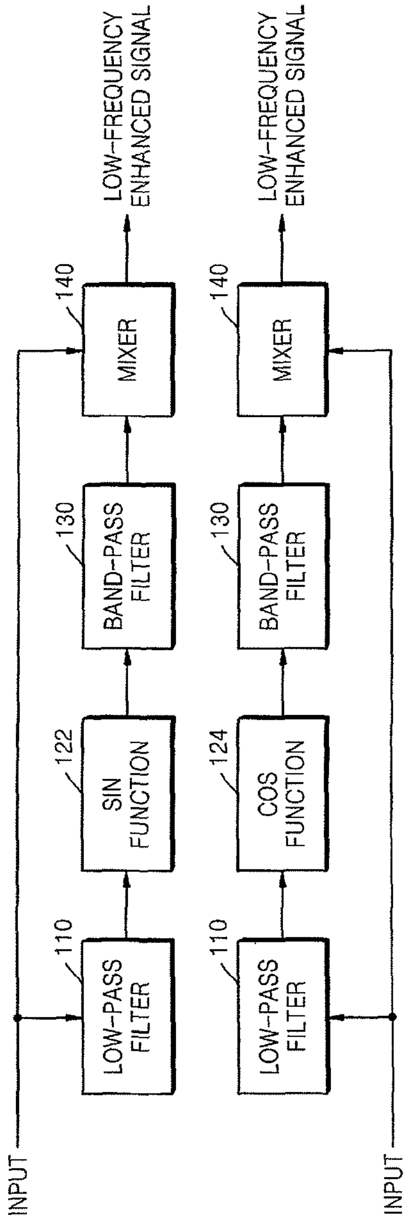
FIG. 1 (PRIOR ART)
FIG. 1 is a block diagram illustrating a conventional low-frequency enhancing apparatus.
Figure 2:
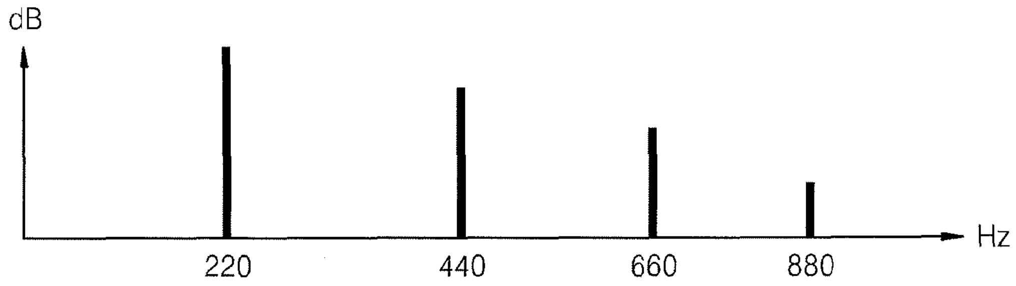
FIG. 2 (RELATED ART)
FIG. 2 is a view illustrating ideal harmonic-frequency signals for frequency component enhancement in an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 3:
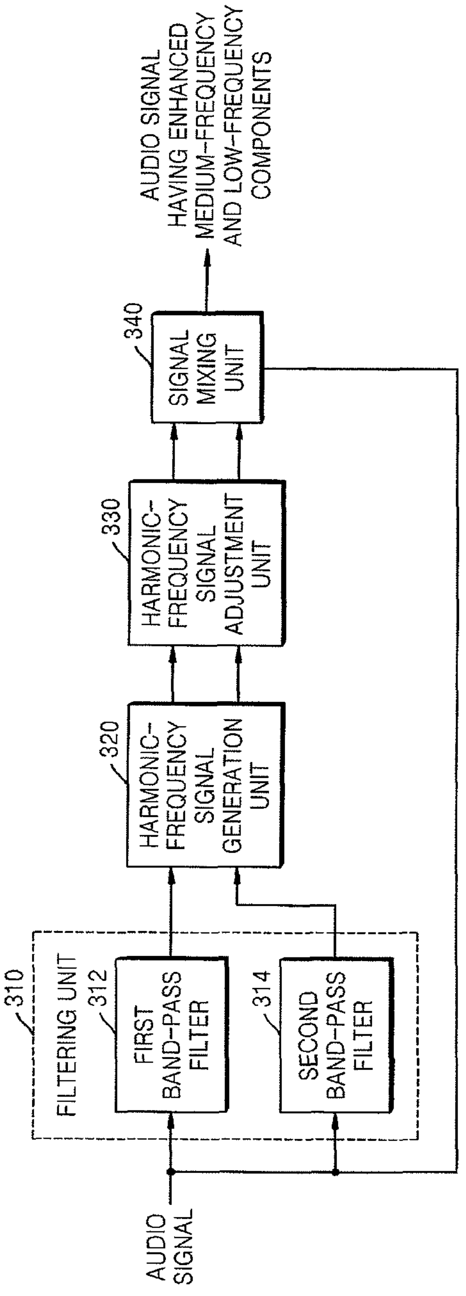
FIG. 3 is a block diagram illustrating an apparatus to enhance low-frequency components and medium-frequency components of an audio signal according to an exemplary embodiment of the present general inventive concept.

FIG. 3 is a block diagram illustrating an apparatus to enhance low-frequency components and medium-frequency components of an audio signal according to an exemplary embodiment of the present general inventive concept.

Referring to FIG. 3, the apparatus includes a filtering unit 310, a harmonic-frequency signal generation unit 320, a harmonic-frequency signal adjustment unit 330, and a signal mixing unit 340.

The filtering unit 310 includes a first band-pass filter 312 and a second band-pass filter 314.

The first band-pass filter 312 extracts audio signals in a low-frequency band from the audio signal.

In order to avoid separate processing for audio signals in a frequency band that cannot be actually reproduced based on characteristics of an actual audio signal reproducing apparatus, a band-pass filter is used instead of a low-pass filter.

For example, a low-frequency band generally ranges from 20 Hz to 200 Hz and some small-size speakers can reproduce only audio signals in frequency bands higher than 60-70 Hz. Therefore, the first band-pass filter 312 extracts only audio signals in a frequency band of 60-200 Hz and performs processing to enhance the filtered audio signals, without processing all the audio signals less than 200 Hz.

However, the bandwidth of the first band-pass filter 312 may vary with a performance of a reproducing apparatus and the implementation used, without being limited to 60-200 Hz.

The second band-pass filter 314 extracts audio signals in a medium-frequency band from the audio signal.

A medium-frequency band generally ranges from 200 Hz to 2 KHz and the bandwidth of the second band-pass filter 314 may also be set to 200 Hz-2 KHz.

In another embodiment of the present general inventive concept, the bandwidth of the second band-pass filter 314 may vary with the implementation used without being limited to 200 Hz-2 KHz. A plurality of band-pass filters, without being limited to two band-pass filters as illustrated in FIG. 3, may be used for a plurality of bands.

The filtering unit 310 may further include a pre-processing filter (not illustrated) and a high-pass filter (not illustrated).

The pre-processing filter (not illustrated) increases energy of harmonic-frequency components of the input audio signal, as will be described later with reference to FIG. 6.

The high-pass filter (not illustrated) performs filtering on the input audio signal to remove low frequency components in order to prevent excessive energy from being concentrated in a low-frequency band by removing a signal in a frequency band that cannot be actually reproduced during reproduction of the input audio signal. For example, the high-pass filter may perform filtering to remove a signal less than 50 Hz.

Accordingly, referring to FIG. 3, when the pre-processing filter (not illustrated) and the high-pass filter (not illustrated) are included in the filtering unit 310, the input audio signal undergoes filtering in the pre-processing filter and the high-pass filter and then is transmitted to the first band-pass filter 312 and the second band-pass filter 314. The audio signal, for example, to be mixed with harmonic-frequency signals by the signal mixing unit 340 have also passed through the pre-processing filter and the high-pass filter.

The harmonic-frequency signal generation unit 320 generates a plurality of harmonic-frequency signals using a plurality of audio signals resulting from band-pass filtering. In FIG. 3, two harmonic-frequency signals are generated using two audio signals resulting from filtering by the first band-pass filter 312 and the second band-pass filter 314.

The harmonic-frequency signals may be generated using a Single-sideband modulation. Single-sideband modulation uses only one of an upper sideband signal and a lower sideband signal generated by amplitude modulation (AM), for example. Single-sideband modulation is advantageous in that an occupied frequency bandwidth is reduced by approximately fifty percent and low transmission power is required with small power consumption. However, various modulation methods to generate harmonic frequencies can be used, without being limited to a Single-sideband modulation.

Figure 4:
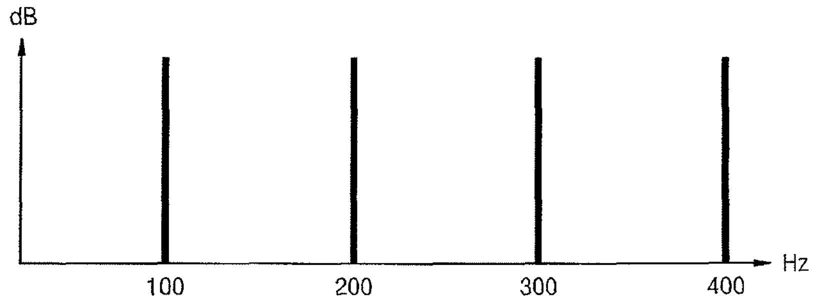
FIG. 4 illustrates harmonic-frequency signals generated by a harmonic-frequency signal generation unit according to an exemplary embodiment of the present general inventive concept.

FIG. 4 illustrates harmonic-frequency signals generated by a harmonic-frequency signal generation unit 320 according to an exemplary embodiment of the present general inventive concept.

FIG. 4 illustrates harmonic-frequency signals with a modulation frequency of 50 Hz, in which harmonic-frequency signals of 200 Hz, 300 Hz, and 400 Hz with respect to frequency components of 100 Hz are illustrated.

As illustrated in FIG. 4, 100 Hz corresponds to low-frequency components and harmonic-frequency signals with respect to the low-frequency components are signals in a medium-frequency band of 200-400 Hz. Similarly, harmonic-frequency signals with respect to medium-frequency signals are signals in a high-frequency band. Since human hearing is most sensitive to the high-frequency band, a person may perceive severe distortion in the tone of the input audio signal when harmonic-frequency signals are mixed with the high-frequency band of the input audio signal. It is also possible that harmonic-frequency signals of the low-frequency components are mixed with the medium-frequency band and/or the high-frequency band, thereby causing the distortion.

Thus, it is necessary to minimize distortion caused by harmonic-frequency signals in a high-frequency band. Accordingly, a post-processing filter may be further included at the end of the pre-processing filter (not illustrated) or the signal mixer 140. The pre-processing filter (not illustrated) and the post-processing filter (not illustrated) will be described later with reference to FIGS. 6 and 7.

The harmonic-frequency signal generation unit 320 generates harmonic-frequency signals with respect to audio signals in frequency bands extracted by the first band-pass filter 312 and the second band-pass filter 314, as illustrated in FIG. 4.

The harmonic-frequency signal adjustment unit 330 adjusts intensity of energy of the harmonic-frequency signals generated by the harmonic-frequency signal generation unit 320.

Figure 5:
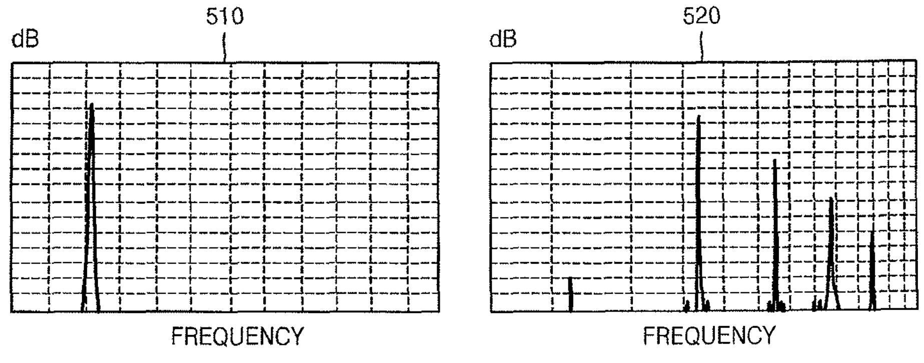
FIG. 5 is a view illustrating harmonic-frequency signals whose amplitudes are adjusted according to an exemplary embodiment of the present general inventive concept.

FIG. 5 is a view illustrating harmonic-frequency signals whose amplitudes are adjusted according to an exemplary embodiment of the present general inventive concept.

A first signal graph 510 corresponds to an audio signal in a low-frequency band and a second signal graph 520 corresponds to harmonic-frequency signals which are generated according to the present general inventive concept to enhance low-frequency components. Referring to the second signal graph 520 of FIG. 5, an amplitude of an audio signal in the low-frequency band is small enough to be neglected when compared to the harmonic-frequency signals, and thus, the sound of low-frequency components of an audio signal is low, i.e., energy of the low-frequency components is small, when the audio signal is output from a small-size device like a small-size speaker.

When comparing the amplitudes of the signals in FIGS. 4 and 5, the second signal graph 520 of in FIG. 5 illustrates that an adjustment has been made to reduce energy as frequency increases. Such an adjustment is made in order to minimize a change in the tone of an audio signal, which may occur when the audio signal is mixed with harmonic-frequency signals having excessive energy.

The signal mixing unit 340 mixes harmonic-frequency signals whose amplitudes are adjusted by the harmonic-frequency signal adjustment unit 330 with the input audio signal, thereby enhancing low-frequency components and medium-frequency components.

Figure 6:
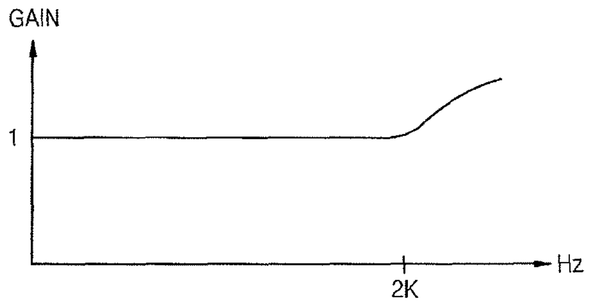
FIG. 6 is a view illustrating a pre-processing filter according to an exemplary embodiment of the present general inventive concept.

FIG. 6 is a view illustrating a pre-processing filter graph according to an exemplary embodiment of the present general inventive concept.

In a graph illustrated in FIG. 6, gain increases as frequency increases from a frequency point of 2 KHz. If filtering is performed using the pre-processing filter, the intensity of energy of audio signals in the harmonic-frequency band increases as frequency increases as illustrated in FIG. 6. The frequency point may vary depending upon the implementation used, without being limited to 2 KHz.

The reason why pre-processing filtering is performed on the input audio signal is that distortion in the tone of the input audio signal, which may occur when the input audio signal is mixed with harmonic-frequency signals, can be minimized by increasing the intensity of energy of harmonic-frequency components of the input audio signal.

If pre-processing filtering has been performed on the input audio signal using the pre-processing filter (not illustrated), the signal mixing unit 340 mixes the harmonic-frequency signals with the audio signal that has undergone pre-processing filtering.

Figure 7:
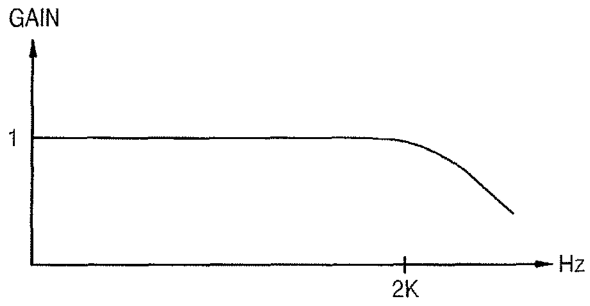
FIG. 7 is a view illustrating a post-processing filter graph according to an exemplary embodiment of the present general inventive concept.

FIG. 7 is a view illustrating a post-processing filter graph according to an exemplary embodiment of the present general inventive concept.

In a graph illustrated in FIG. 7, gain decreases as frequency increases from a frequency point of 2 KHz. The post-processing filter is connected at the end of the signal mixing unit 340 illustrated in FIG. 3 and performs filtering on the audio signal mixed with the harmonic-frequency signals using a filter having a characteristic illustrated in FIG. 7.

Accordingly, the energy of high-frequency components in the input audio signal having enhanced low-frequency and medium-frequency components is reduced in order to minimize distortion in the tone of the input audio signal by reducing the energy of the high-frequency components. The reducing of the energy of the high-frequency components alleviate an influence of the harmonic-frequency signals mixed with the high-frequency components of the audio signal because human hearing is sensitive to the harmonic-frequency components of the audio signal.

Figure 8:
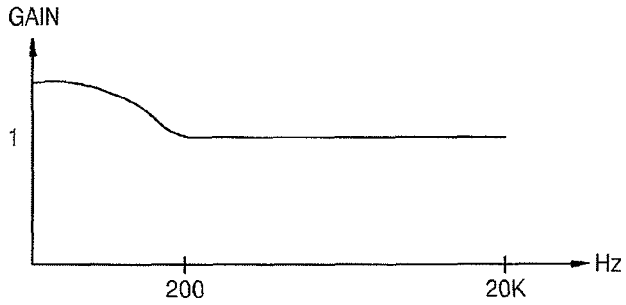
FIG. 8 is a view illustrating a post-processing filter graph according to another exemplary embodiment of the present general inventive concept.

FIG. 8 is a view illustrating a post-processing filter graph according to another exemplary embodiment of the present general inventive concept.

In a graph illustrated in FIG. 8, gain increases as frequency decreases from a frequency point of 200 Hz.

As mentioned above, the post-processing filter is connected at the end of the signal mixing unit 340 illustrated in FIG. 3 and performs filtering on the audio signal mixed with the harmonic-frequency signals using a filter having a characteristic illustrated in FIG. 7.

By increasing intensity of energy of audio signals in the low-frequency band, energy of audio signals in the low-frequency band can be sufficiently enhanced.

Accordingly, in an embodiment of the present general inventive concept, since harmonic-frequency signals are generated for all audio signals in the low frequency band extracted by the first band-pass filter 312, instead of detecting a fundamental frequency and generating harmonic-frequency signals with respect to the fundamental frequency, audio signals in the low-frequency band may not be sufficiently enhanced. Therefore, a compensation process of increasing intensity of energy of audio signals in the low-frequency band is performed using a filter.

However, filtering performed by the pre-processing filter and the post-processing filter may be omitted. Moreover, in an embodiment of the present general inventive concept, a frequency band uses audible frequencies 20 Hz and 20 KHz as a lower limit and an upper limit, respectively.

Figure 9:
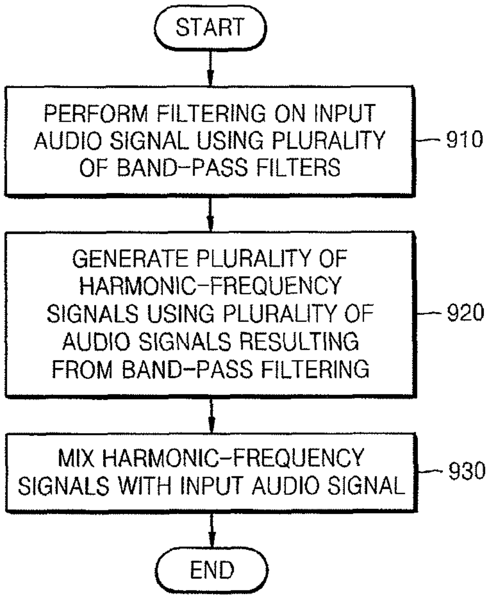
FIG. 9 is a flowchart illustrating a method of enhancing low-frequency components and medium-frequency components of an audio signal according to an exemplary embodiment of the present general inventive concept.

FIG. 9 is a flowchart illustrating a method of enhancing low-frequency components and medium-frequency components of an audio signal according to an exemplary embodiment of the present general inventive concept.

Referring to FIG. 9, in operation 910, filtering is performed on an input audio signal using a plurality of band-pass filters.

For example, a first band-pass filter may extract audio signals in a low-frequency band, i.e., a frequency band of 20-200 Hz, and a second band-pass filter may extract audio signals in a medium-frequency band, i.e., a frequency band of 200 Hz-2 KHz.

The filtering may be performed using a pre-processing filter to increase intensity of energy of harmonic-frequency components of the input audio signal and a high-pass filter to remove low-frequency components of the input audio signal. Also, pre-processing filtering may be performed to minimize distortion due to harmonic-frequency signals in the high-frequency band by increasing intensity of energy of the high-frequency components of the input audio signal High-pass filtering is performed to prevent excessive energy from being concentrated in the low-frequency band by removing signals in a frequency band that cannot be actually reproduced.

However, filtering using the pre-processing filter and the high-pass filter may be omitted according to the implementation used.

In operation 920, a plurality of harmonic-frequency signals are generated using a plurality of audio signals resulting from band-pass filtering.

Also, Single-sideband modulation may be used to generate harmonic-frequency signals.

In operation 930, the plurality of harmonic-frequency signals are mixed with the input audio signal.

The input audio signal may have passed through the pre-processing filter and the high-pass filter.

Filtering to reduce the intensity of energy of the high-frequency components may also be performed on the audio signal mixed with the harmonic-frequency signals using a post-processing filter in order to minimize distortion in the tone of the input audio signal. However, filtering using the post-processing filter may be omitted according to the implementation used.

Meanwhile, the various embodiments of the present general inventive concept can be embodied as computer-readable codes on a computer-readable medium. The computer-readable medium is any data storage device that can store data that can be read by a computer system.

Examples of the computer-readable media include magnetic storage media such as read-only memory (ROM), random access memory (RAM), magnetic tapes, floppy disks, and hard disks, optical data storage devices such as CD-ROMs and digital versatile discs (DVD), and carrier waves such as data transmission over the Internet. The computer-readable medium can also be distributed over network-coupled computer systems so that the computer-readable code is stored and executed in a distributed fashion. Also, functional programs, codes, and code segments to accomplish the present general inventive concept can be easily construed by programmers skilled in the art to which the present general inventive concept pertains.

As described above, according to various embodiments of the present general inventive concept, an input audio signal is band-pass filtered using a plurality of band-pass filters, a plurality of harmonic-frequency signals are generated using a plurality of audio signals resulting from band-pass filtering, the generated harmonic-frequency signals are mixed with the input audio signal, thereby enhancing low-frequency components and medium-frequency components of the input audio signal using human perception characteristics without physically boosting the energy of the low-frequency components and the energy of the medium-frequency components.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A method of enhancing one or more low-frequency components and one or more medium-frequency components of an unmodified input audio signal, the method comprising:

performing filtering on the unmodified input audio signal using a plurality of band-pass filters;

generating a plurality of harmonic-frequency signals using a plurality of audio signals resulting from the performing filtering operation;

adjusting amplitudes of the plurality of harmonic-frequency signals; and mixing the plurality of amplitude adjusted harmonic-frequency signals with the unmodified input audio signal, wherein the adjusting amplitudes of the plurality of harmonic-frequency signals comprises reducing energy of harmonic-frequency as frequency increases, and wherein the performing the filtering comprises extracting one or more audio signals in a low-frequency band and a medium-frequency band from the unmodified input audio signal.

2. The method of claim 1, wherein the performing filtering comprises performing filtering using a first band-pass filter that extracts the one or more audio signals in a frequency band of 60-200 Hz and a second band-pass filter that extracts the one or more audio signals in a frequency band of 200 Hz-2 KHz.

3. The method of claim 1, wherein the generation of the plurality of harmonic-frequency signals comprises generating the plurality of harmonic-frequency signals using a Single-sideband modulation.

4. The method of claim 1, further comprising:

performing high-pass filtering on the unmodified input audio signal.

5. The method of claim 1, wherein an intensity of energy of audio signals in a predetermined frequency band of the unmodified input audio signal is increased.

6. The method of claim 5, wherein the intensity of energy of the audio signals in a frequency band of 2-20 KHz is increased.

7. The method of claim 1, wherein the increasing or reducing of the intensity comprises reducing the intensity of energy of the audio signals in a frequency band of 2-20 KHz.

8. The method of claim 1, wherein the increasing or reducing of the intensity comprises increasing the intensity of energy of the audio signals in a frequency band of 0-200 Hz.

9. An apparatus to enhance one or more low-frequency components and one or more medium-frequency components of an unmodified input audio signal, the apparatus comprising:

a filtering unit to perform filtering on the unmodified input audio signal using a plurality of band-pass filters;

a harmonic-frequency signal generation unit to generate a plurality of harmonic-frequency signals using a plurality of audio signals resulting from the filtering of the plurality of the band-pass filters;

a harmonic-frequency signal adjustment unit to adjust amplitudes of the plurality of harmonic-frequency signals so as to reduce the energy of harmonic-frequency as frequency increases; and a mixing unit to mix the plurality of amplitude adjusted harmonic-frequency signals with the unmodified input audio signal, wherein the filtering unit extracts one or more audio signals in a low-frequency band and a medium-frequency band from the unmodified input audio signal.

10. The apparatus of claim 9, wherein the filtering unit includes a first band-pass filter that extracts the one or more audio signals in a frequency band of 60-200 Hz and a second band-pass filter that extracts the one or more audio signals in a frequency band of 200 Hz-2 KHz.

11. The apparatus of claim 9, wherein the harmonic-frequency signal generation unit generates the plurality of harmonic-frequency signals using a Single-sideband modulation.

12. The apparatus of claim 9, wherein the filtering unit includes a high-pass filter to perform high-pass filtering on the unmodified input audio signal.

13. The apparatus of claim 9, wherein the filtering unit includes a pre-processing filter to increase an intensity of energy of audio signals in a predetermined frequency band of the unmodified input audio signal.

14. The apparatus of claim 13, wherein the pre-processing filter increases the intensity of energy of the audio signals in a frequency band of 2-20 KHz.

15. The apparatus of claim 9, wherein the post-processing filter reduces the intensity of energy of the audio signals in a frequency band of 2-20 KHz.

16. The apparatus of claim 9, wherein the post-processing filter increases the intensity of energy of the audio signals in a frequency band of 0-200 Hz.

17. A non-transitory computer-readable medium containing computer readable codes to perform a method of enhancing one or more low-frequency components and one or more medium-frequency components of an unmodified input audio signal, the method comprising:

performing filtering on the unmodified input audio signal using a plurality of band-pass filters;

generating a plurality of harmonic-frequency signals using a plurality of audio signals resulting from the performing filtering operation;

adjusting amplitudes of the plurality of harmonic-frequency signals; and mixing the plurality of amplitude adjusted harmonic-frequency signals with the unmodified input audio signal, wherein the adjusting amplitudes of the plurality of harmonic-frequency signals comprises reducing the energy of harmonic-frequency as frequency increases, and wherein the performing the filtering comprises extracting one or more audio signals in a low-frequency band and a medium-frequency band from the unmodified input audio signal.

18. An apparatus to enhance an unmodified audio signal, the apparatus comprising:

a first band-pass filter to extract one or more low-frequency signals from the unmodified audio signal;

a second band-pass filter to extract one or more medium-frequency signals from the unmodified audio signal;

a harmonic-frequency signal generation unit to generate a first set of harmonic-frequency signals from the one or more low-frequency signals and a second set of harmonic-frequency signals from the one or more medium-frequency signals;

a harmonic-frequency signal adjustment unit to adjust amplitudes of the first set of harmonic-frequency signals and the second set of harmonic-frequency signals so as to reduce energy of harmonic-frequency as frequency increases; and a mixing unit to mix the unmodified audio signal, the adjusted first set of harmonic-frequency signals and the second set of harmonic-frequency signals, wherein the first band-pass filter extracts the one or more low-frequency signals in a low-frequency band from the audio signal, and the second band-pass filter extracts the one or more medium-frequency signals in a medium-frequency band from the unmodified audio signal.

19. The apparatus according to claim 18, wherein the one or more low-frequency signals are in the low-frequency band of substantially 60-200 Hz and the one or more medium-frequency signals are in the medium-frequency band of substantially 200 Hz-2 KHz.

20. The apparatus according to claim 18, further comprising:

a pre-processing filter to filter the unmodified audio signal; and a post-processing filter to filter an output of the mixing unit.

21. A method of enhancing an unmodified audio signal, the method comprising:

filtering the unmodified audio signal to extract one or more low-frequency signals in a low-frequency band and one or more medium-frequency signals in a medium-frequency band;

generating a first set of harmonic-frequency signals from the one or more low-frequency signals and a second set of harmonic-frequency signals from the one or more medium-frequency signals;

adjusting amplitudes of the first set of harmonic-frequency signals and the second set of harmonic-frequency signals so as to reduce the energy of harmonic-frequency as frequency increases; and mixing the unmodified audio signal, the adjusted first set of harmonic-frequency signals and the second set of harmonic-frequency signals.

22. An apparatus to enhance an unmodified input audio signal, comprising:

a harmonic-frequency signal generation unit to generate one or more first harmonic signals from one or more low-frequency signals in a first band of an unmodified input audio signal and one or more second harmonic signals from one or more medium-frequency signals in a second band of the unmodified input audio signal;

a harmonic-frequency signal adjustment unit to adjust amplitudes of the one or more first harmonic signals and the one or more second harmonic signals so as to reduce the energy of harmonic-frequency as frequency increases; and a mixing unit to mix the amplitude adjusted first harmonic signals and the amplitude adjusted second harmonic signals with the unmodified input audio signal.

23. The apparatus according to claim 22, further comprising:

a filtering unit to filter the unmodified input audio signal to separate frequencies of the first band and frequencies of the second band from the input audio signal.

24. The apparatus according to claim 22, wherein the first band comprises low frequency components of the unmodified input audio signal, and the second band comprises medium frequency components of the unmodified input audio signal.

* * * * *